United States Patent
Koga et al.

(10) Patent No.: US 11,329,471 B2
(45) Date of Patent: May 10, 2022

(54) ARC DETECTION CIRCUIT, BREAKER SYSTEM, CONNECTION BOX SYSTEM, POWER CONDITIONER, MICRO INVERTER, DC OPTIMIZER, AND ARC DETECTION METHOD

(71) Applicant: Panasonic Intellectual Property Management Co., Ltd., Osaka (JP)

(72) Inventors: Tatsuo Koga, Osaka (JP); Atsushi Okita, Osaka (JP); Mitsuru Kaji, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 61 days.

(21) Appl. No.: 16/757,846

(22) PCT Filed: Sep. 21, 2018

(86) PCT No.: PCT/JP2018/034969
§ 371 (c)(1),
(2) Date: Apr. 21, 2020

(87) PCT Pub. No.: WO2019/082564
PCT Pub. Date: May 2, 2019

(65) Prior Publication Data
US 2021/0194235 A1 Jun. 24, 2021

(30) Foreign Application Priority Data
Oct. 27, 2017 (JP) .............................. JP2017-207835

(51) Int. Cl.
*H02H 1/00* (2006.01)
*G01R 31/333* (2006.01)
(Continued)

(52) U.S. Cl.
CPC ....... *H02H 1/0015* (2013.01); *G01R 31/1236* (2013.01); *G01R 31/16* (2013.01);
(Continued)

(58) Field of Classification Search
None
See application file for complete search history.

(56) References Cited

U.S. PATENT DOCUMENTS

| 5,729,145 A | * | 3/1998 | Blades | G01R 31/1272 324/613 |
| 7,492,163 B2 | * | 2/2009 | Restrepo | H02H 1/0015 324/424 |

(Continued)

FOREIGN PATENT DOCUMENTS

| CN | 101702936 A | * 5/2010 | ........ H01J 37/32055 |
| JP | 2016-166773 A | 9/2016 | |

OTHER PUBLICATIONS

International Search Report (ISR) and Written Opinion dated Dec. 11, 2018 in International (PCT) Application No. PCT/JP2018/034969.

*Primary Examiner* — Jermele M Hollington
(74) *Attorney, Agent, or Firm* — Renner, Otto, Boisselle & Sklar, LLP

(57) ABSTRACT

An arc detection circuit includes a current detector and arc determination unit. The current detector detects a current flowing through a transmission line which connects an electric power supply device and an electric power conversion circuit. The arc determination unit calculates, from a result of measurement of the current, an area of interest and an area for comparison. The area of interest is an area of a region of interest defined by a predetermined frequency range and predetermined time for determination. The area for comparison is an area of a portion in which detected strength exceeds a predetermined strength threshold in the (Continued)

region of interest. The arc determination unit determines an electric arc has occurred when a ratio between the area of interest and the area for comparison exceeds a predetermined area-ratio threshold.

15 Claims, 6 Drawing Sheets

(51) Int. Cl.
*G01R 31/12* (2020.01)
*G01R 31/58* (2020.01)
*G01R 31/16* (2006.01)
*H02S 40/30* (2014.01)
*H02S 50/00* (2014.01)

(52) U.S. Cl.
CPC ......... *G01R 31/3333* (2013.01); *G01R 31/58* (2020.01); *H02S 40/30* (2014.12); *H02S 50/00* (2013.01)

(56) References Cited

U.S. PATENT DOCUMENTS

| | | | |
|---|---|---|---|
| 10,535,987 B2* | 1/2020 | Lee | H02H 3/06 |
| 10,985,693 B2* | 4/2021 | Okita | G01R 31/52 |
| 11,088,528 B2* | 8/2021 | Koga | H02H 3/16 |
| 2016/0282398 A1* | 9/2016 | Zhu | G01R 31/1227 |
| 2017/0343596 A1 | 11/2017 | Misumi | |
| 2018/0062372 A1* | 3/2018 | Lee | H02H 3/06 |
| 2018/0231597 A1* | 8/2018 | Ashida | H02H 1/0015 |
| 2020/0014189 A1* | 1/2020 | Koga | G01R 31/12 |

* cited by examiner

ARC DETECTION CIRCUIT, BREAKER SYSTEM, CONNECTION BOX SYSTEM, POWER CONDITIONER, MICRO INVERTER, DC OPTIMIZER, AND ARC DETECTION METHOD

TECHNICAL FIELD

The present invention relates to an arc detection circuit that detects an electric arc that occurs in a transmission line which connects an electric power supply device and an electric power conversion circuit. In addition, the present invention relates to a breaker system, a connection box system, a power conditioner, a micro inverter, and a direct-current (DC) optimizer each of which includes the arc detection circuit. Furthermore, the present invention relates to an arc detection method for detecting an electric arc that occurs in the transmission line which connects the electric power supply device and the electric power conversion circuit.

BACKGROUND ART

Conventionally, a detection device which detects the occurrence of an electric arc has been developed (for example, see Patent Literature (PTL) 1). An arc detection device according to PTL 1 generates a power spectrum from a result of detecting a current flowing through an electric power line which connects a DC power source and an electric power conversion circuit, and detects an electric arc by comparing, with a predetermined threshold, an integrated value of a high-frequency power spectrum as a feature quantity.

CITATION LIST

Patent Literature

PTL 1: Japanese Unexamined Patent Application Publication No. 2016-166773

SUMMARY OF THE INVENTION

Technical Problem

However, the arc detection device according to PTL 1 occasionally fails to accurately detect an electric arc due to erroneously detecting, for example, noise made by a breaker in which detected strength momentarily increases in the entire frequency range as noise caused by the occurrence of an electric arc.

The present invention has been conceived in view of the above. The present invention aims to provide an arc detection circuit that can highly accurately detect the occurrence of an electric arc. In addition, the present invention aims to provide a breaker system, a connection box system, a power conditioner, a micro inverter, and a DC optimizer each of which includes the arc detection circuit that can highly accurately detect the occurrence of an electric arc. Furthermore, the present invention aims to provide an arc detection method for highly accurately detecting the occurrence of an electric arc.

Solutions to Problem

In order to overcome the problem above, an arc detection circuit according to the present invention includes: a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component. The arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest.

Or the arc detection circuit according to the present invention includes: a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component. The arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest.

In addition, a breaker system according to the present invention includes: the arc detection circuit described above; and a breaker that operates according to a result of determination made by the arc determination unit.

Furthermore, a connection box system according to the present invention includes: the arc detection circuit described above; a solar cell string which is the electric power supply device; and a connection box for connecting a power conditioner that includes the electric power conversion circuit.

Moreover, a power conditioner according to the present invention includes: the arc detection circuit described above; and the electric power conversion circuit to which electric power is supplied from the electric power supply device through the transmission line.

In addition, a micro inverter according to the present invention includes: the arc detection circuit described above; and the electric power conversion circuit. The micro inverter is provided in a solar panel which is the electric power supply device.

Furthermore, a direct current (DC) optimizer according to the present invention includes: the arc detection circuit described above; and a DC/DC converter. The DC optimizer is provided in a solar panel which is the electric power supply device.

Moreover, an arc detection method according to the present invention includes: detecting a current flowing through a transmission line which connects an electric power supply device and an electric power conversion circuit; calculating, from a result of measurement of the current, an area of interest and an area for comparison, the area of interest being an area of a region of interest defined by a predetermined frequency range and predetermined time for determination, the area for comparison being an area of a portion in which detected strength exceeds a predetermined strength threshold in the region of interest; and determining, by comparing a ratio between the area of interest and the area for comparison which are calculated in the calculating and a predetermined area-ratio threshold, whether an electric arc has occurred.

Advantageous Effects of Invention

An arc detection circuit according to the present invention can highly accurately determine the occurrence of an electric arc. In addition, the occurrence of an electric arc can be highly accurately determined by using a breaker system, a connection box system, a power conditioner, a micro inverter, a DC optimizer, and an arc detection method according to the present invention.

DESCRIPTION OF EXEMPLARY EMBODIMENTS

Hereinafter, an arc detection circuit, a breaker system, a connection box system, a power conditioner, a micro inverter, a DC optimizer, and an arc detection method according to an embodiment of the present invention will be described in detail.

Note that the following embodiments described are examples of the present invention, and the numerical values, the materials, the structural elements, etc. illustrated in the following embodiments are also mere examples. Therefore, the following embodiments are not intended to limit the present invention. Note that the drawings are schematic diagrams, and do not necessarily provide strictly accurate illustration. Throughout the drawings, the same reference sign is given to substantially the same element, and redundant description is omitted or simplified.

Embodiment 1

Figure 1:
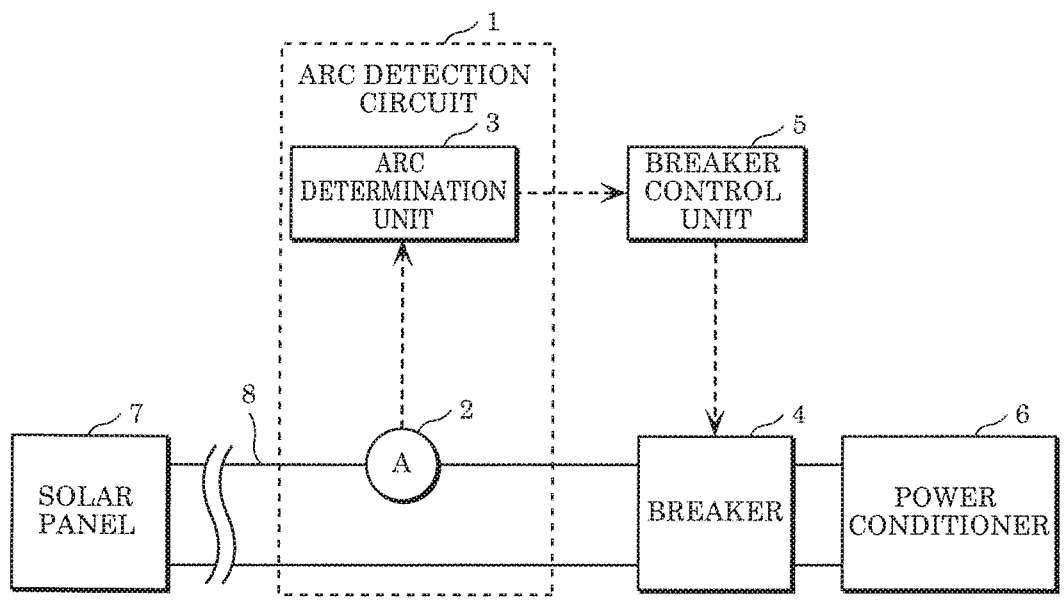
FIG. 1 is a block diagram schematically illustrating an arc detection circuit according to Embodiment 1.
Figure 2:
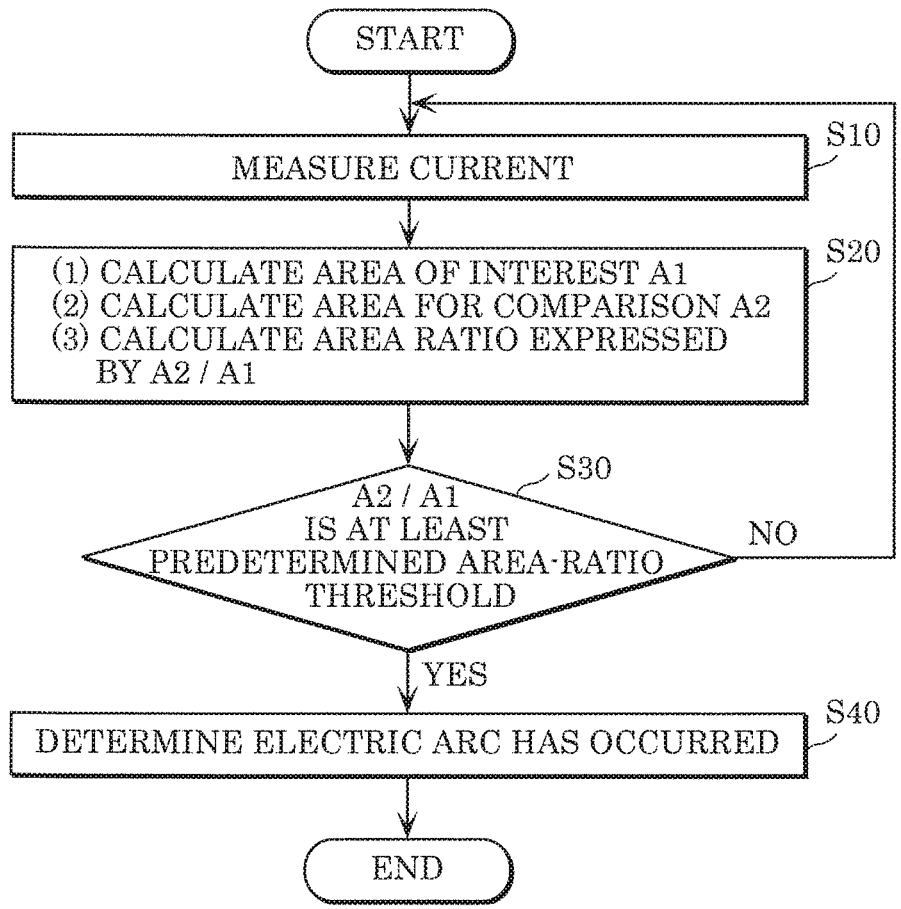
FIG. 2 is a flowchart illustrating an example of operation of the arc detection circuit according to Embodiment 1.
Figure 3:
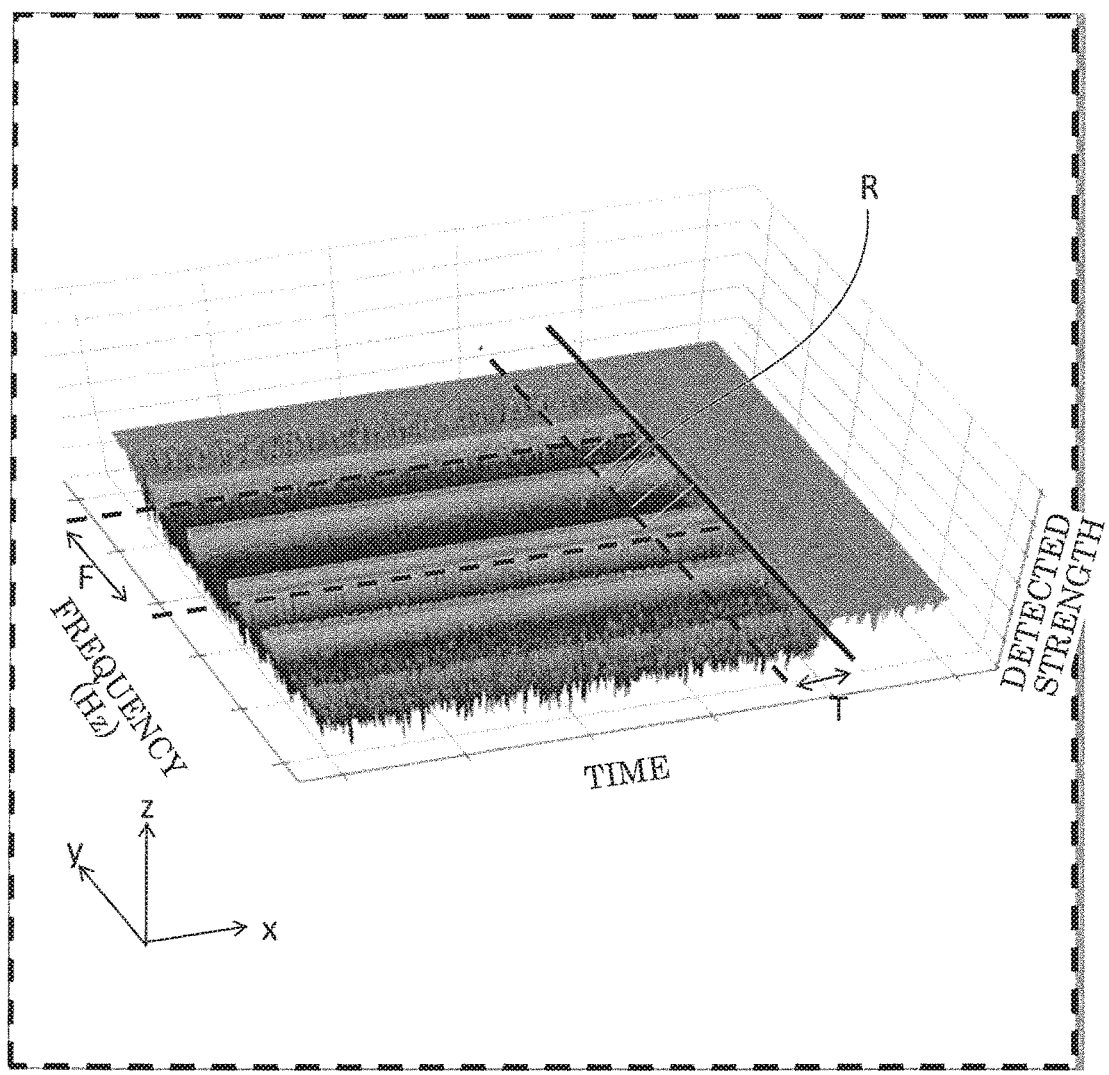
FIG. 3 is a graph illustrating an example of a result of measurement of a current.
Figure 4:
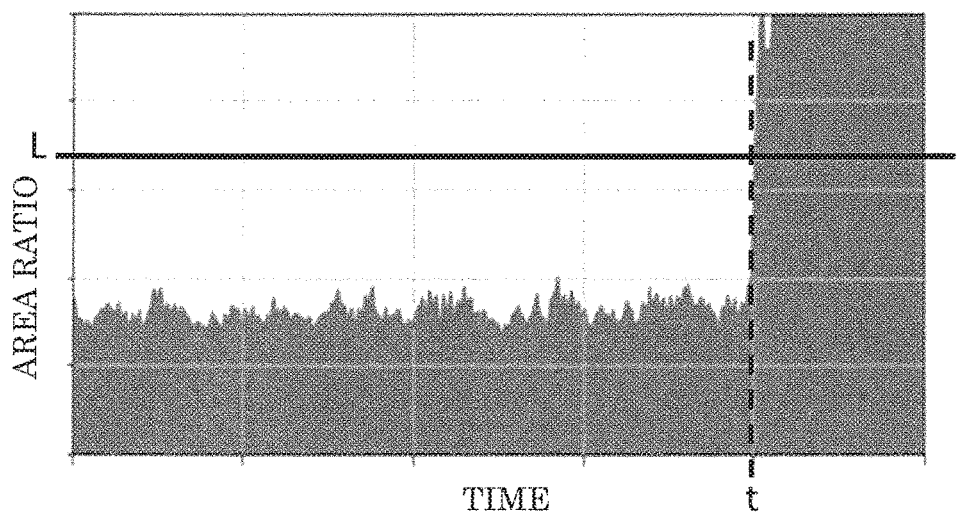
FIG. 4 is a time series graph illustrating an example of a ratio between an area of interest and an area for comparison when monitored.

Hereinafter, arc detection circuit 1 according to Embodiment 1 will be described with reference to FIG. 1 through FIG. 4. FIG. 1 is a block diagram schematically illustrating arc detection circuit 1 according to Embodiment 1. FIG. 2 is a flowchart illustrating an example of operation of arc detection circuit 1 according to Embodiment 1. FIG. 3 is a graph illustrating an example of a result of measurement of a current. FIG. 4 is a time-series graph illustrating an example of a ratio between an area of interest and an area for comparison when monitored.

[Configuration]

Arc detection circuit 1 is a circuit for detecting the occurrence of an electric arc in transmission line 8 that connects an electric power supply device, such as solar panel 7, and an electric power conversion circuit which converts DC power supplied by the electric power supply device into alternating-current (AC) power. In Embodiment 1, the electric power conversion circuit is provided in power conditioner 6.

The electric power supply device is, for example, solar panel 7, and is a device that supplies a direct current which is generated by electric power generation, etc. to transmission line 8. In addition, the electric power conversion circuit is a circuit which converts DC power supplied from the electric power supply device into AC power. The electric power conversion circuit is, for example, a DC/AC inverter, and converts the DC power supplied from the electric power supply device into AC power of 50 Hz or 60 Hz.

Transmission line 8 is a power line through which the DC power supplied from the electric power supply device is transmitted to the electric power conversion circuit. Transmission line 8 includes a conductor that includes a conductive material, such as copper, and a coating that includes an insulating member which protects the conductor. For example, when the coating deteriorates, an electric arc (namely, an arc discharge) occurs in transmission line 8.

Power conditioner 6 converts, by using the electric power conversion circuit, the DC power supplied from the electric power supply device into AC power, and then outputs the AC power. The maximum power point tracking (MPPT) method that is used for power conditioner 6 allows a value of each of a current and a voltage of the DC power supplied from solar panel 7 to be adjusted to maximize the DC power, for example.

For example, power conditioner 6 converts the DC power supplied from the electric power supply device into AC power having a voltage of 100 V and a frequency of 50 Hz or 60 Hz. The AC power converted by power conditioner 6 is used for household appliances, etc.

Arc detection circuit 1 includes current detector 2 and arc determination unit 3. Current detector 2 measures a current flowing through transmission line 8 which connects the electric power supply device and the electric power conversion circuit. Arc determination unit 3 analyzes a result of measurement of the current detected by current detector 2, based on a frequency component, a time component, and a strength component.

In order to analyze the result of the measurement of the current based on the frequency component, the time component, and the strength component, arc determination unit 3 calculates the frequency spectrum of a current signal detected by current detector 2 by applying Fourier transform to a time waveform of the current signal. Then, arc determination unit 3 analyzes, using a time variation of the frequency spectrum, the result of the measurement of the current with a three-axis graph indicating frequency, time, and strength. Specifically, arc determination unit 3 analyzes the result of the measurement of the current by converting the result of the measurement of the current into the three-axis graph.

Arc determination unit 3 derives a three-axis graph as illustrated in FIG. 3, using a result of measurement of electric power. In FIG. 3, the x axis represents time, the y axis represents frequency, and the z axis represents detected strength. Arc determination unit 3 calculates area of interest A1 which is the area of region of interest R (a portion with white oblique lines) that is defined by predetermined frequency range F and predetermined time for determination T, as illustrated in FIG. 3.

In addition, arc determination unit 3 calculates area for comparison A2 which is the area of a portion in which detected strength exceeds the predetermined strength threshold in region of interest R. Then, arc determination unit 3 calculates the ratio between area of interest A1 and area for comparison A2, which is expressed by A2/A1, and determines an electric arc has occurred when the ratio expressed by A2/A1 exceeds predetermined area-ratio threshold L. In FIG. 4, arc determination unit 3 determines an electric arc has occurred at time t, for example.

Here, predetermined frequency range F is a frequency range which includes a frequency caused by noise resulting from an electric arc when the electric arc has occurred. The frequency caused by noise resulting from an electric arc when the electric arc has occurred can be experimentally obtained.

Each of the upper frequency and the lower frequency of predetermined frequency range F is changeable by setting such that predetermined frequency range F includes the frequency caused by noise resulting from an electric arc.

Predetermined time for determination T is the width of region of interest R in the time direction. The unit of predetermined time for determination T is a second, for example. In addition, predetermined time for determination T is changeable by setting.

Arc determination unit 3 can distinguish between momentary noise resulting from a breaker, etc. and continuous noise resulting from an electric arc by analyzing the result of the measurement of the current detected by current detector 2, using predetermined time for determination T. With this, it is possible for arc detection circuit 1 to highly accurately detect noise resulting from an electric arc.

The predetermined strength threshold is a value greater than the strength of a frequency spectrum in the state in which no noise is made and less than the strength of noise resulting from an electric arc. The predetermined strength threshold can be experimentally obtained. The unit of the predetermined strength threshold is $A^2/Hz$. The predetermined strength threshold is changeable by setting the threshold within a value between a value greater than or equal to the strength of a frequency spectrum in the state in which no noise is made and a value less than or equal to the strength of noise resulting from an electric arc.

Predetermined area-ratio threshold L is a value greater than the ratio between area of interest A1 and area for comparison A2 in the state in which no noise is made and less than the ratio between area of interest A1 and area for comparison A2 in the state in which noise resulting from an electric arc is generating. Predetermined area-ratio threshold L can be experimentally obtained. Predetermined area-ratio threshold L is changeable by setting the threshold within a value between a value greater than or equal to the ratio between area of interest A1 and area for comparison A2 in the state in which no noise is made and a value less than or equal to the ratio between area of interest A1 and area for comparison A2 in the state in which noise resulting from an electric arc is generating.

Arc determination unit 3 outputs an arc occurrence signal to an external device when arc determination unit 3 determines an electric arc has occurred. In Embodiment 1, arc determination unit 3 outputs, to breaker control unit 5, an arc occurrence signal which is a signal indicating that an electric arc has occurred when arc determination unit 3 determines an electric arc has occurred. Breaker control unit 5 causes breaker 4 to operate when breaker control unit 5 receives the arc occurrence signal from arc determination unit 3, and blocks the transmission of electric power through transmission line 8. With this, it is possible to reduce the transmission of electric power in the state in which an electric arc is occurring.

Note that the destination of the arc occurrence signal outputted by arc determination unit 3 is not limited to breaker control unit 5. For example, arc detection circuit 1 may be configured to output the arc occurrence signal from arc determination unit 3 to a display, an alarm system, etc. so that a warning can be issued to a user via the display, the alarm system, etc.

[Current Detector]

Current detector 2 is a device that detects a current flowing through transmission line 8 from the electric power supply device to the electric power conversion circuit. Current detector 2 outputs, as a current signal detected, a result of measurement of the current to arc determination unit 3.

Current detector 2 may include, for example, a resistance element having a very small resistance value. By inserting such a resistance element in transmission line 8 to detect a voltage applied to the resistance element, a value corresponding to the current flowing through transmission line 8 can be detected. Note that current detector 2 may include a sensor, such as an integrated circuit (IC). For example, current detector 2 may include a sensor which uses a Hall element and a magnetic core. In this case, the magnetic core is placed such that transmission line 8 passes through the magnetic core, so that a magnetic field corresponding to the current flowing through transmission line 8 is generated in the magnetic core. Then, a voltage corresponding to the magnetic field (that is to say, a current flowing through transmission line 8) is generated through the Hall element placed in the magnetic field. With this, current detector 2 can detect a value corresponding to the current flowing through transmission line 8.

[Arc Determination Unit]

Arc determination unit 3 determines whether an electric arc has occurred in transmission line 8 by analyzing the current signal that is the result of the measurement of the current from current detector 2, based on a frequency component, a time component, and a strength component detected. Arc determination unit 3 outputs an arc occurrence signal to an external device, such as breaker control unit 5, when arc determination unit 3 determines an electric arc has occurred.

Arc determination unit 3 may include, for example, a microcontroller unit (MCU). The MCU is a semiconductor integrated circuit etc. which include, for example, an input circuit etc. which include read-only memory (ROM) in which a program is stored, random-access memory (RAM), a processor (central processing unit (CPU)) which executes the program, a timer, an A/D converter, and a D/A converter.

[Operation]

Hereinafter, arc detection circuit 1 according to Embodiment 1 will be described with reference to FIG. 2.

Arc detection circuit 1 detects, using current detector 2, a current flowing through transmission line 8 (step S10). Next, by analyzing a current signal that is the result of the measurement of the current from current detector 2, arc determination unit 3 calculates: (1) area of interest A1, (2)

area for comparison A2, and (3) the ratio between area of interest A1 and area for comparison A2, which is expressed by A2/A1 (step S20).

First of all, a frequency spectrum is calculated by applying Fourier transform to the current signal from current detector 2 in step S20. Then, using a time variation of the frequency spectrum, the result of the measurement of the current is analyzed with a three-axis graph indicating frequency, time, and strength.

Next, (1) arc determination unit 3 calculates area of interest A1 which is the area of region of interest R defined by predetermined frequency range F and predetermined time for determination T. Also, (2) arc determination unit 3 calculates area for comparison A2 which is the area of a portion in which detected strength exceeds the predetermined strength threshold in region of interest R. Then, (3) arc determination unit 3 calculates the ratio of area for comparison A2 to area of interest A1, which is expressed by A2/A1.

Next, arc determination unit 3 determines whether the ratio expressed by A2/A1 is at least predetermined area-ratio threshold L (step S30). When the ratio expressed by A2/A1 is less than predetermined area-ratio threshold L (NO in step S30), arc determination unit 3 determines an electric arc has not occurred, and continues monitoring the current.

On the contrary, when the ratio expressed by A2/A1 is at least predetermined area-ratio threshold L (YES in step S30), arc determination unit 3 determines an electric arc has occurred (step S40). In Embodiment 1, arc determination unit 3 outputs an arc occurrence signal to an external device when arc determination unit 3 determines an electric arc has occurred. For example, when the arc occurrence signal is outputted to breaker control unit 5, breaker control unit 5 operates a breaker and blocks the transmission of electric power flowing through transmission line 8.

[Advantageous Effect, Etc. of Arc Detection Circuit According to Embodiment]

Here, main points of arc detection circuit 1 according to Embodiment 1 will be described again.

Arc detection circuit 1 according to Embodiment 1 includes current detector 2 and arc determination unit 3. Current detector 2 detects a current flowing through transmission line 8 which connects the electric power supply device and the electric power conversion circuit. Arc determination unit 3 determines the occurrence of an electric arc in transmission line 8 by analyzing a result of measurement of the current detected by current detector 2, based on a frequency component, a time component, and a strength component. Arc determination unit 3 calculates, from the result of the measurement of the current, area of interest A1 which is the area of region of interest R defined by predetermined frequency range F and predetermined time for determination T, and area for comparison A2 which is the area of a portion in which detected strength exceeds the predetermined strength threshold in region of interest R. Then, arc determination unit 3 determines an electric arc has occurred when the ratio of area for comparison A2 to area of interest A1, which is expressed by A2/A1, is at least predetermined area-ratio threshold L.

Arc detection circuit 1 having the configuration as described above can distinguish momentary noise resulting from a breaker, etc. and continuous noise resulting from an electric arc, therefore it is possible for arc detection circuit 1 to highly accurately detect noise resulting from an electric arc.

Furthermore, in arc detection circuit 1 according to Embodiment 1, each of predetermined frequency range F, predetermined time for determination T, the predetermined strength threshold, and predetermined area-ratio threshold L is changeable by setting.

With the above configuration, each of the frequency range, the time for determination, the strength threshold, and the area-ratio threshold can be more appropriately set according to differences between devices, such as the electric power supply device and transmission line 8, therefore it is possible for arc detection circuit 1 to highly accurately detect an electric arc according to various circumstances.

In addition, the present invention is also useful as a breaker system by combining arc detection circuit 1 and breaker 4 as described above.

The breaker system according to the embodiment includes arc detection circuit 1 and breaker 4 which operates according to a result of determination made by arc determination unit 3.

The breaker system having the configuration as described above can highly accurately detect an electric arc, therefore it is possible for breaker 4 to appropriately block the transmission of electric power through transmission line 8 when the occurrence of an electric arc is detected.

Other Embodiment

Although the above Embodiment 1 has described arc detection circuit 1 and the breaker system according to the present invention, the present invention is not limited to arc detection circuit 1 and the breaker system according to Embodiment 1.

For example, although each of predetermined frequency range F, predetermined time for determination T, the predetermined strength threshold, and predetermined area-ratio threshold L in Embodiment 1 is changeable by setting, the setting can be specified by inputting a value etc. to or selecting a value etc. from an input/output interface (a display, a keyboard, a mouse, a touch panel, etc.) which a device that includes arc detection circuit 1 is provided with.

Figure 6:
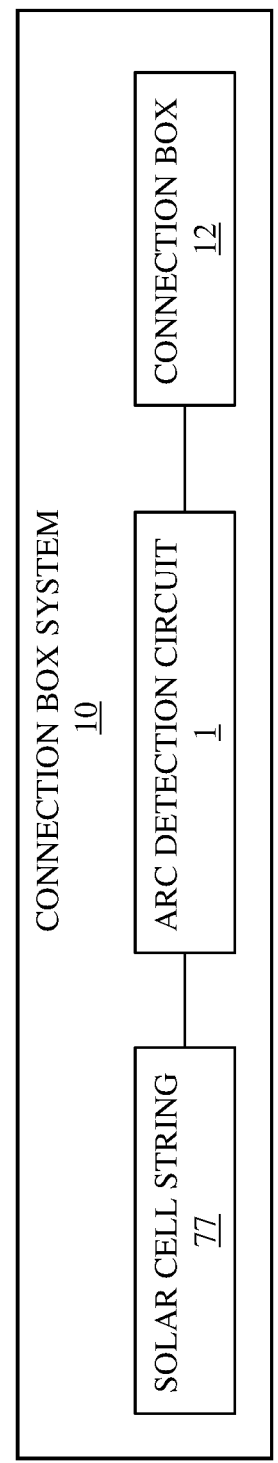
FIG. 6 is a block diagram of a connection box system.

In addition, the present invention is also useful for a connection box system. As shown in FIG. 6, the connection box system 10 includes arc detection circuit 1, a solar cell string 77 which is an electric power supply device, and a connection box 12 for connecting power conditioner 6 which includes an electric power conversion circuit.

The connection box system having the configuration as described above can highly accurately detect noise resulting from an electric arc, therefore it is possible for the connection box system to deal with the occurrence of an electric arc before electric power is supplied to power conditioner 6 when the electric arc has occurred. For example, when the electric arc has occurred, the transmission of electric power to power conditioner 6 can be stopped.

Furthermore, the present invention is also useful as a power conditioner. Power conditioner 6 includes arc detection circuit 1 and an electric power conversion circuit to which electric power is supplied from the electric power supply device through transmission line 8.

Power conditioner 6 having the configuration as described above can highly accurately detect noise resulting from an electric arc, therefore it is possible for power conditioner 6 to deal with the occurrence of an electric arc before electric power is supplied to power conditioner 6 when the electric arc has occurred. For example, when the electric arc has occurred, the transmission of electric power to the electric power conversion circuit can be stopped.

Figure 7:
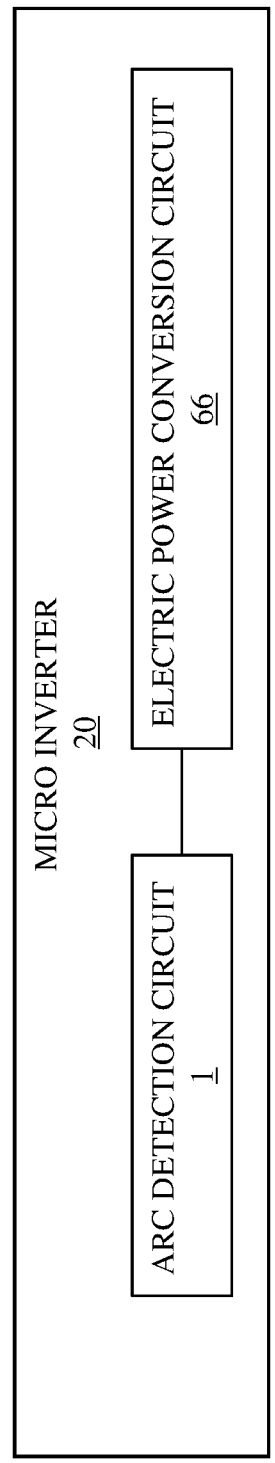
FIG. 7 is a block diagram of a micro inverter.

Moreover, the present invention is also useful as a micro inverter. As shown in FIG. 7, the micro inverter 20 includes arc detection circuit 1 and the electric power conversion circuit 66. A plurality of the micro inverters is provided in solar panel 7 which is the electric power supply device.

The plurality of the micro inverters having the configuration as described above can highly accurately detect the occurrence of an electric arc inside each of the plurality of the micro inverters. For example, when an arc occurs, only a micro inverter in which an electric arc is occurring can be stopped from operating among the plurality of the micro inverters.

Figure 8:
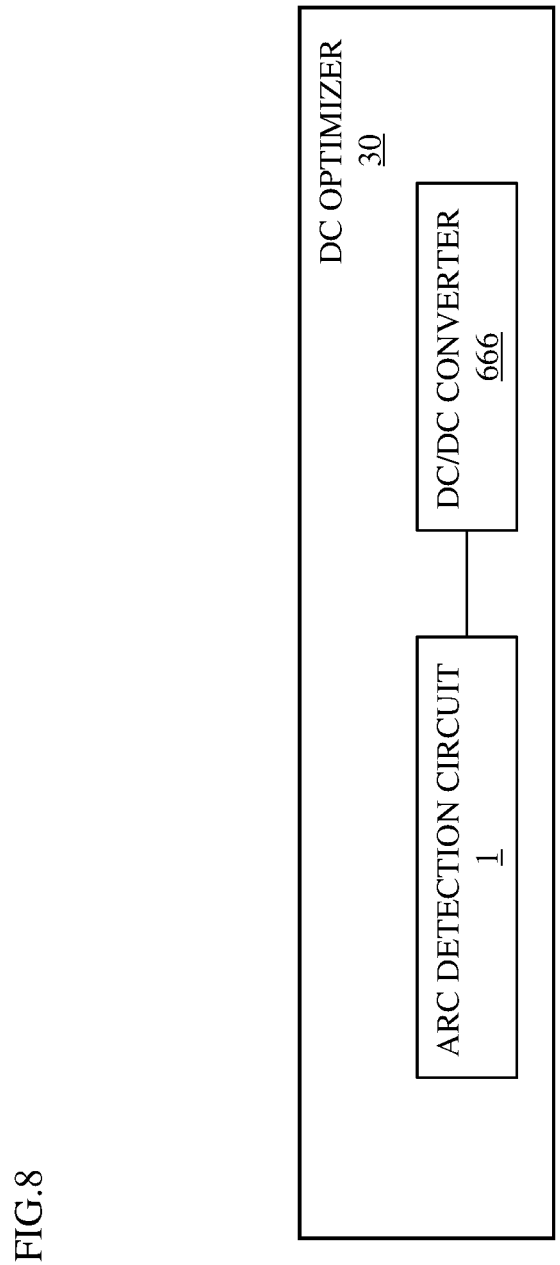
FIG. 8 is a block diagram of a DC optimizer.

In addition, the present invention is also useful as a DC optimizer. As shown in FIG. 8, the DC optimizer 30 includes arc detection circuit 1 and a DC/DC converter 666. A plurality of the DC optimizers is provided in solar panel 7 which is the electric power supply device.

The plurality of the DC optimizers having the configuration as described above can highly accurately detect the occurrence of an electric arc inside each of the plurality of the DC optimizer. For example, when an arc occurs, only a DC optimizer in which an electric arc is occurring can be stopped from operating among the plurality of the DC optimizers.

Furthermore, the present invention is also useful as an arc detection method. The arc detection method includes a current detection step, an area calculation step, and an arc determination step. In the current detection step, a current flowing through transmission line 8 which connects an electric power supply device and an electric power conversion circuit is detected. In the area calculation step, area of interest A1 which is an area of region of interest R defined by predetermined frequency range F and predetermined time for determination T, and area for comparison A2 which is an area of a portion in which detected strength exceeds a predetermined strength threshold in region of interest R are calculated using a result of measurement of the current detected in the current detection step. In the arc determination step, the ratio between area of interest A1 and the area for comparison A2 which is calculated in the area calculation step and predetermined area-ratio threshold L are compared to determine whether an electric arc has occurred.

The arc detection method as described above can distinguish momentary noise resulting from a breaker, etc. and continuous noise resulting from an electric arc, therefore it is possible to highly accurately detect noise resulting from an electric arc.

For example, the steps in the arc detection method described above may be executed by a computer (computer system). In addition, the present invention can be realized as a program for causing the computer to execute the steps included in the method. Furthermore, the present invention can be realized as a non-transitory computer-readable recording medium, such as a CD-ROM, in which the program is recorded.

In addition, although arc determination unit 3 determines the occurrence of an electric arc using the ratio expressed by A2/A1 in Embodiment 1, arc determination unit 3 may determine the occurrence of the electric arc using the ratio expressed by A1/A2. Note that the value of a predetermined area-ratio threshold used for determining the occurrence of an electric arc using the ratio expressed by A1/A2 is different from the value of predetermined area-ratio threshold L used for determining whether an electric arc has occurred using the ratio expressed by A2/A1.

The arc detection circuit according to Other Embodiment includes current detector 2 and arc determination unit 3. Current detector 2 detects a current flowing through transmission line 8 which connects an electric power supply device and an electric power conversion circuit. Arc determination unit 3 determines the occurrence of an electric arc in transmission line 8 by analyzing a result of measurement of the current detected by current detector 2, based on a frequency component, a time component, and a strength component. Arc determination unit 3 calculates, from the result of the measurement of the current, area of interest A1 which is the area of region of interest R defined by predetermined frequency range F and predetermined time for determination T, and area for comparison A2 which is the area of a portion in which detected strength exceeds the predetermined strength threshold in region of interest R. Then, arc determination unit 3 determines an electric arc has occurred when the ratio of area of interest A1 to area for comparison A2, which is expressed by A1/A2, is at most the predetermined area-ratio threshold. Note that although arc determination unit 3 has, for example, the same hardware configuration as arc determination unit 3 in Embodiment 1, the method for determining whether an electric arc has occurred is different. That is to say, a program stored in a memory which the MCU includes for realizing arc determination unit 3 is different.

Figure 5:
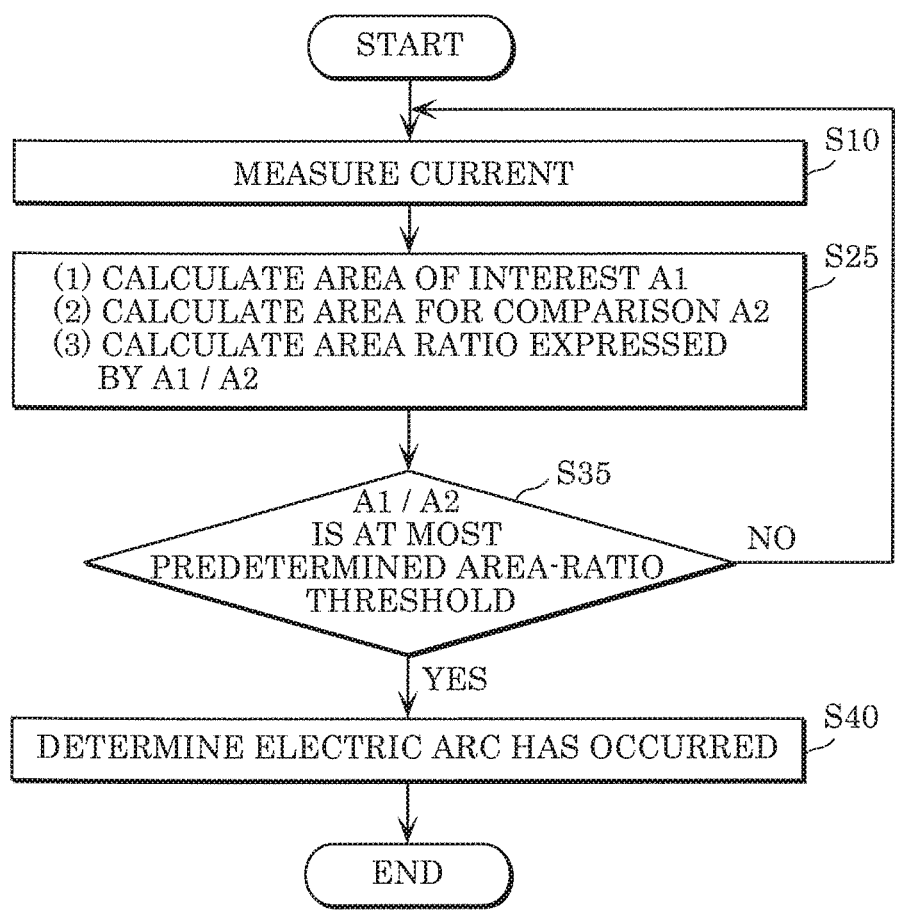
FIG. 5 is a flowchart illustrating an example of operation of the arc detection circuit according to Other Embodiment.

FIG. 5 is a flowchart illustrating an example of operation of arc detection circuit 1 according to Other Embodiment. Arc detection circuit 1 detects, using current detector 2, a current flowing through transmission line 8 (step S10).

Next, by analyzing a current signal from current detector 2 which is the result of the measurement of the current, arc determination unit 3 calculates: (1) area of interest A1, (2) area for comparison A2, and (3) the ratio between area for comparison A2 and area of interest A1, which is expressed by A1/A2 (step S25).

First of all, a frequency spectrum is calculated by applying Fourier transform to the current signal from current detector 2 in step S25. Then, using a time variation of this frequency spectrum, the result of the measurement of the current is analyzed with a three-axis graph indicating frequency, time, and strength.

Next, (1) arc determination unit 3 calculates area of interest A1 which is the area of region of interest R defined by predetermined frequency range F and predetermined time for determination T. Also, (2) arc determination unit 3 calculates area for comparison A2 which is the area of a portion in which detected strength exceeds the predetermined strength threshold in region of interest R. Then, (3) arc determination unit 3 calculates the ratio of area of interest A1 to area for comparison A2, which is expressed by A1/A2.

Next, arc determination unit 3 determines whether the ratio expressed by A1/A2 is at most the predetermined area-ratio threshold (step S35). When the ratio expressed by A1/A2 is greater than the predetermined area-ratio threshold (NO in step S35), arc determination unit 3 determines an electric arc has not occurred, and continues monitoring the current. On the contrary, when the ratio expressed by A1/A2 is at most the predetermined area-ratio threshold (YES in step S35), arc determination unit 3 determines an electric arc has occurred (step S40).

Arc detection circuit 1 having the configuration as described above can also distinguish momentary noise resulting from a breaker, etc. and continuous noise resulting from an electric arc, therefore it is possible for arc detection circuit 1 to highly accurately detect noise resulting from an electric arc.

Although Embodiment 1 has described the electric power supply device as solar panel 7, the electric power supply device is not limited to a solar cell. The electric power supply device may be, for example, a power generator, such as a fuel cell.

In the embodiments described above, arc detection circuit 1 is realized like software using the MCU, but arc detection circuit 1 may be realized like software using a general-purpose computer, such as a personal computer. In addition, arc detection circuit 1 may be realized like hardware using a dedicated electric circuit which includes an analog-to-digital converter (A/D converter), a logic circuit, a gate array, a digital-to-analog converter (D/A converter), etc.

Note that the embodiments described above each exemplify an aspect of the present invention, and numerical values, shapes, etc. are only suitable examples. Therefore, the present invention is not limited to only the embodiments described above. Changes can be made as appropriate to the configurations so long as the changes are made within the scope of the inventive concept of the present invention.

In addition, the present invention also encompasses: embodiments achieved by applying various modifications conceivable to those skilled in the art to each embodiment; and embodiments achieved by optionally combining the structural elements and the functions of each embodiment without departing from the essence of the present invention.

The invention claimed is:

1. An arc detection circuit, comprising:
a current detector that detects a current flowing through a transmission line which connects an electric power supply device and an electric power conversion circuit; and
an arc determination unit configured to determine an occurrence of an electric arc in the transmission line by analyzing a result of measurement of the current detected by the current detector, based on a frequency component, a time component, and a strength component, wherein
the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest.

2. The arc detection circuit according to claim 1, wherein each of the predetermined frequency range, the predetermined time for determination, the predetermined strength threshold, and the predetermined area-ratio threshold is changeable by setting.

3. A breaker system, comprising:
a current detector that detects a current flowing through a transmission line which connects an electric power supply device and an electric power conversion circuit; and
an arc determination unit configured to determine an occurrence of an electric arc in the transmission line by analyzing a result of measurement of the current detected by the current detector, based on a frequency component, a time component, and a strength component, wherein
the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and
a breaker that operates according to a result of determination made by the arc determination unit.

4. A connection box system, comprising:
a current detector that detects a current flowing through a transmission line which connects an electric power supply device and an electric power conversion circuit; and
an arc determination unit configured to determine an occurrence of an electric arc in the transmission line by analyzing a result of measurement of the current detected by the current detector, based on a frequency component, a time component, and a strength component, wherein
the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest;
a solar cell string which is the electric power supply device; and
a connection box for connecting a power conditioner that includes the electric power conversion circuit.

5. A power conditioner, comprising:
a current detector that detects a current flowing through a transmission line which connects an electric power supply device and an electric power conversion circuit; and
an arc determination unit configured to determine an occurrence of an electric arc in the transmission line by analyzing a result of measurement of the current detected by the current detector, based on a frequency component, a time component, and a strength component, wherein
the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and
the electric power conversion circuit to which electric power is supplied from the electric power supply device through the transmission line.

6. A micro inverter, comprising:
a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and the electric power conversion circuit, wherein the micro inverter is provided in a solar panel which is the electric power supply device.

7. A direct current (DC) optimizer, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area for comparison to the area of interest is at least a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and a DC/DC converter, wherein the DC optimizer is provided in a solar panel which is the electric power supply device.

8. An arc detection circuit, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest.

9. The arc detection circuit according to claim 8, wherein each of the predetermined frequency range, the predetermined time for determination, the predetermined strength threshold, and the predetermined area-ratio threshold is changeable by setting.

10. A breaker system, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and a breaker that operates according to a result of determination made by the arc determination unit.

11. A connection box system, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest;

a solar cell string which is the electric power supply device; and a connection box for connecting a power conditioner that includes the electric power conversion circuit.

12. A power conditioner, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and the electric power conversion circuit to which electric power is supplied from the electric power supply device through the transmission line.

13. A micro inverter, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and the electric power conversion circuit, wherein the micro inverter is provided in a solar panel which is the electric power supply device.

14. A direct current (DC) optimizer, comprising:

a current detector that detects a current flowing through a transmission line which connects an electric power supply device and an electric power conversion circuit; and an arc determination unit configured to determine an occurrence of an electric arc in the transmission line by analyzing a result of measurement of the current detected by the current detector, based on a frequency component, a time component, and a strength component, wherein the arc determination unit is configured to calculate, from the result of the measurement of the current, an area of interest and an area for comparison, and determines an electric arc has occurred when a ratio of the area of interest to the area for comparison is at most a predetermined area-ratio threshold, the area of interest being an area of a region of interest defined by a predetermined frequency range and predetermined time for determination, the area for comparison being an area of a portion in which detected strength exceeds a predetermined strength threshold in the region of interest; and a DC/DC converter, wherein the DC optimizer is provided in a solar panel which is the electric power supply device.

15. An arc detection method, comprising:

detecting a current flowing through a transmission line which connects an electric power supply device and an electric power conversion circuit;

calculating, from a result of measurement of the current, an area of interest and an area for comparison, the area of interest being an area of a region of interest defined by a predetermined frequency range and predetermined time for determination, the area for comparison being an area of a portion in which detected strength exceeds a predetermined strength threshold in the region of interest; and determining, by comparing a ratio between the area of interest and the area for comparison which are calculated in the calculating and a predetermined area-ratio threshold, whether an electric arc has occurred.

* * * * *